United States Patent [19]

Iwamoto et al.

[11] Patent Number: 4,591,951
[45] Date of Patent: May 27, 1986

[54] MOUNTING ARRANGEMENT FOR ELECTRONIC COMPONENTS

[75] Inventors: Shigeyoshi Iwamoto, Jyoyo; Yoshifumi Saeki, Hirakata; Takashi Kuribayashi, Yawata; Shinichiro Ishitsuka, Chitose; Nobukuni Ogino, Kyoto, all of Japan

[73] Assignee: Matsushita Electric Industrial Co., Ltd., Kadoma, Japan

[21] Appl. No.: 633,889

[22] Filed: Jul. 24, 1984

[51] Int. Cl.⁴ .............................................. H05K 1/18
[52] U.S. Cl. .................................... 361/417; 361/306; 361/405; 361/433; 174/138 G
[58] Field of Search ............... 361/403, 405, 380, 306, 361/433, 400, 404, 417–419; 174/525, 138 G; 339/278 C; 200/265

[56] References Cited

U.S. PATENT DOCUMENTS

| 2,736,830 | 2/1956 | Sauaga | 100/265 |
| 3,143,626 | 8/1964 | Schreiner | 200/265 |
| 3,398,332 | 8/1968 | Logan | 174/525 |
| 3,955,124 | 5/1976 | Jones | 361/404 |
| 4,115,325 | 9/1978 | Santala | 200/265 |
| 4,499,009 | 2/1985 | Yamanaka | 200/265 |

FOREIGN PATENT DOCUMENTS

| 897490 | 5/1962 | United Kingdom | 174/525 |
| 1043359 | 9/1966 | United Kingdom | 174/138 G |

*Primary Examiner*—G. P. Tolin
*Attorney, Agent, or Firm*—Cushman, Darby & Cushman

[57] ABSTRACT

An electronic component contained in a metal case is attached with an insulation mold at a sealing part and lead wires of the electronic component element are passing through holes on the insulator base, and the end parts of the lead wires are bent in recesses on the insulator base, thereby constituting surface mounting type electronic component.

10 Claims, 14 Drawing Figures

MOUNTING ARRANGEMENT FOR ELECTRONIC COMPONENTS

BACKGROUND OF THE INVENTION

1. Field of the Technology

The present invention relates to an electronic component suitable for use in an apparatus using a printed circuit board.

The present invention especially concerns electronic component of lead-less type electronic component, such as lead-less type electrolytic capacitor which is suitable for use on a printed circuit board.

2. Description of the Prior Art

Recently, electronic components are developing to be miniaturized more and more in order to be suitable for use to be assembled on a printed circuit board to form an electronic apparatus or the like. In order to be used in such use, the lead-less type electronic components of this kind, for instance chip-type aluminum capacitor is constituted as shown in FIG. 1(a) which is a cross sectional side view and FIG. 1(b) which is a front view of the same one. That is, a known electrolytic capacitor element 1 is made by roughening aluminum foil surface, forming dielectric oxide film on the surface by anodization to make anode foil, followed by winding together with a cathode foil made by the similar process with a separator inbetween, and followed by soaking electrolyte. And the electrolytic capacitor element 1 is put in a metal case 2. Then, the opening end of the metal case 2 is sealed with a sealing member 3 of a rubber or the like resilient material with lead wires 4, 4 penetrating therethrough, by calking the periphery of the opening part of the metal can 2. In an electrolytic capacitor main body thus made, the lead wires 4, 4 are welded to comb-shaped terminals 5, and plastic mold cover 6 is formed by molding, and thereafter the comb-shaped lead wires are cut to complete individual chip-shaped electrolytic capacitors. Such type of the conventional aluminum electrolytic capacitors have such problem that since the electrolytic capacitor element main body 1 is subject to a high temperature and high pressure of about 100°-150° C. for 5 min. and 10 kg/cm$^2$ when molding, and such severe condition results in evaporation away of electrolyte thereby further resulting in undesirable deterioration of characteristics such as decrease of capacitance and increase of tan δ. And furthermore, the molding process takes some time and expense. Furthermore, as shown in FIG. 1, the length of the completed chip type electrolytic capacitor or the like electronic component requires a considerable area of mounting on the printed circuit board, since the conventional one has the electrolytic capacitor element main body 1 transversely mounted in spite of its actual smallness of size.

SUMMARY OF THE INVENTION

Accordingly, the purpose of the present invention is to provide an improved electronic component which has small area of installation on printed circuit board, is manufactured with stable and accurate characteristic as designed and being inexpensive in manufacturing.

An electrolytic component in accordance with the present invention comprises:

a case containing an electronic component element therein and having a sealing part, wherein an opening of the case is sealed by calking the former thereby holding a sealing member through which lead wires are led out, and an insulator base fixed abutted to the sealing part, and having at least a through-hole through which the lead wires are led out.

DESCRIPTION OF THE PREFERRED EMBODIMENT

Figure 1A:
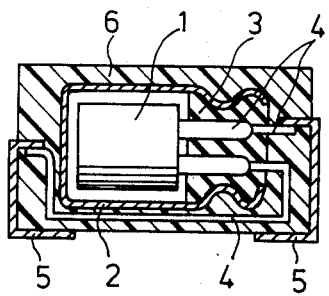
FIG. 1(a) is the cross-sectional view of the conventional chip-type electronic component.
Figure 1B:
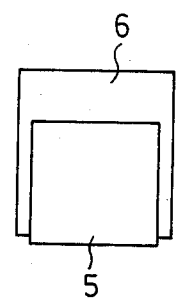
FIG. 1(b) is the front view of the same conventional electronic component.
Figure 2:
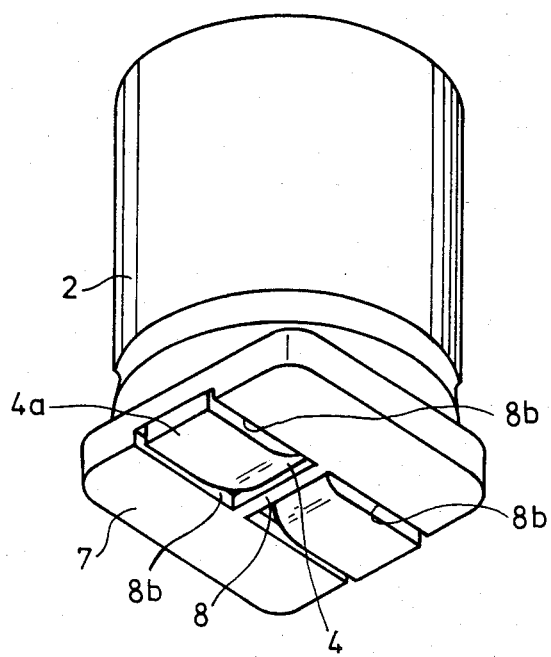
FIG. 2 is a perspective view of a first embodiment of the present invention.

FIG. 2 shows a first embodiment of an electronic component in accordance with the present invention. The electronic component of the first embodiment comprises a metal case 2 containing a known electrolytic capacitor element and an insulator base 7 attached on a sealing part of the metal case 2. The inside configuration of the metal case together with lead wires 4, 4 therefrom are shown in the cross-sectional view of FIG. 5. That is, the lead wires 4, 4 are led out from the sealing part of the metal case 2 and the lead wires 4, 4 are led out through a pair of through-holes 8a, 8a of the insulator base 7, and end part 4a, 4a of the lead wires 4, 4 are bent in grooves 8b, 8b.

Figure 5:
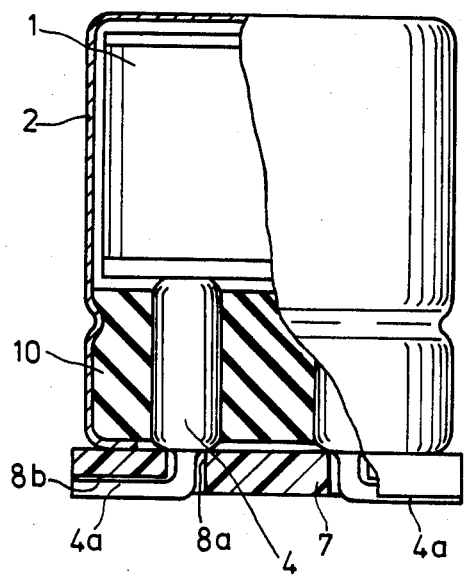
FIG. 5 is a cross-sectional side view of the first embodiment of the present invention.
Figure 5A:
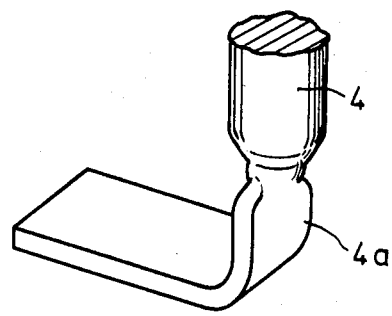
FIG. 5A is a perspective view showing a configuration of a lead-wire 4.

The grooves 8b, 8b are isolated by an isolation bank 8c which serves to prevent short-circuiting by solder sticking on the lead wires 4a, 4a. One example of the lead wires 4 is shown in FIG. 5A, wherein the stem part of the lead wire 4 is connected to aluminum lead terminal of the electrolytic capacitor element by electric welding, and the almost part of the lead wire 4 is pressed into flat shape and is bent in vertical direction after passing the through-holes 8a, 8a of the insulator base 7.

Figure 3:
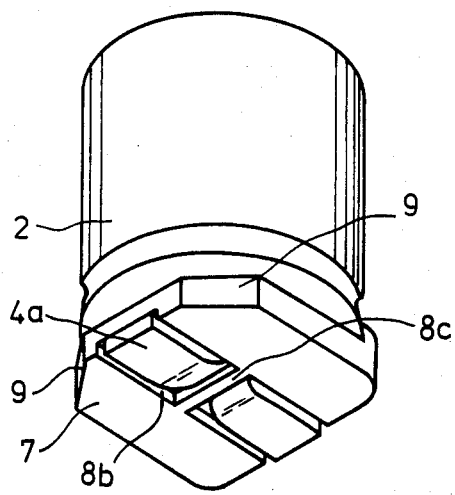
FIG. 3 is a perspective view of another embodiment of the invention.
Figure 4A:
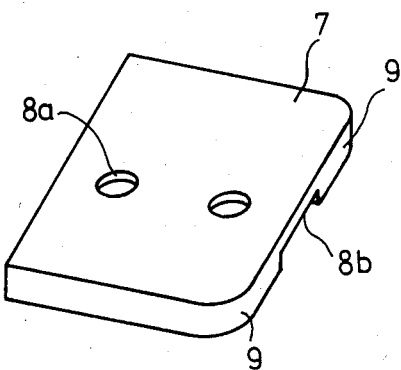
FIG. 4(a), FIG. 4 (b)
Figure 4B:
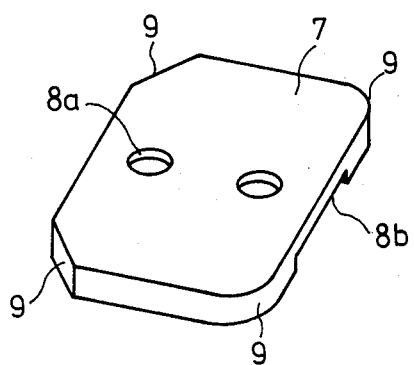
FIG. 4(c), FIG. 4(d) and FIG. 4(e) are perspective views of various modification of the insulator bases of the electrnonic components of the present invention.
Figure 4C:
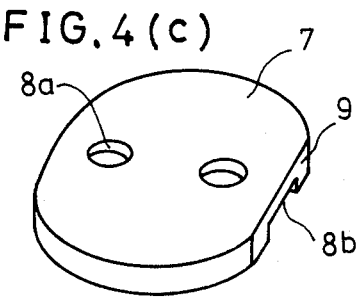
Figure 4D:
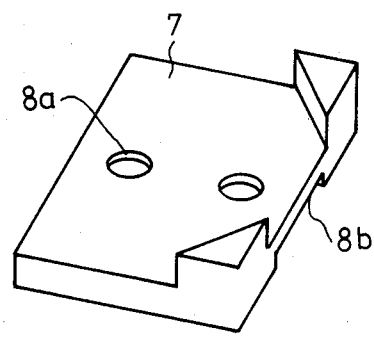
Figure 4E:
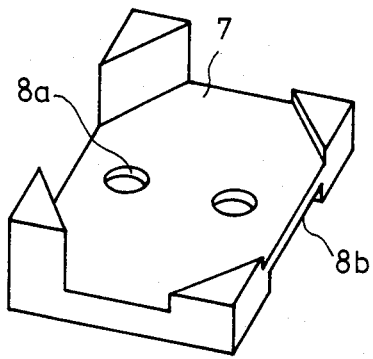

FIG. 3 shows a preferred embodiment wherein the insulator base 7 has two cut away parts 9, 9 at two corner parts thereof in order to indicate positive side lead wire 4a. Such indication is helpful for detection by a sensing device of an automatic insertion machine. FIG. 4(a), FIG. 4(b) . . . FIG. 4(e) show various types of the insulator bases, each having means to indicate direction of the positive lead wire.

The above-mention configuration provide the following advantages:

(1) Since plastic mold covering is omitted, there is no fear of generating undesirable deterioration of characteristic such as decrease of capacitance or increase of tan δ, and manufacturing cost becomes cheaper.

(2) Since the electronic component element is disposed in vertical shape, there is no need of occupying undue large installation area on a printed circuit board.

(3) By making the insulator base in asymmetric shape, an automatic detection of polarity of the lead wire becomes easy, thereby enabling automatic insertion of the electronic component with certainty.

Figure 6:
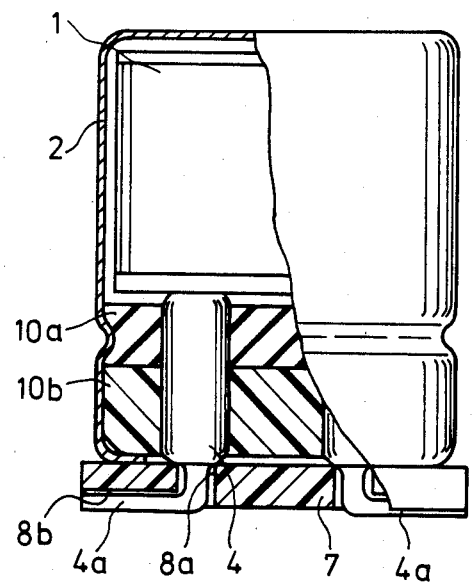
FIG. 6 is a cross-sectional view of another embodiment.
Figure 7:
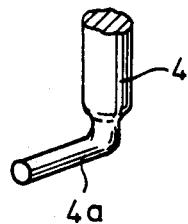
FIG. 7 is a perspective view of another example of lead wire 4.

Nextly, configuration of the sealing part is described with reference to FIG. 5 and FIG. 6. In the above-mentioned embodiment, the sealing part has a sealing member consisting of one layer of resilient material such as a heat resistant rubber 10. In another modified example, the sealing member may be constituted by a composite layers of a heat resistant rubber layer 10a and a heat resistant non-rubber layer 10b of, for instance polytetrafluoroethylene. Bonding of the two layers may be made by polarizing the bonding surfaces by utilizing metal sodium to treat the surfaces. By using the above-mentioned two layered composite sealing member, both high resistance against heat and high resistance against pressure are obtainable with economically available materials. Besides the flattened configuration of the lead wires 4, 4, shown in FIG. 5A, the lead wires 4, 4 may be used with round sectional shape as shown in FIG. 7.

Figure 8:
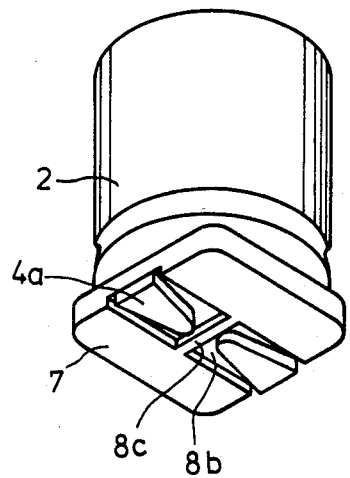
FIG. 8 is a perspective view of another embodiment.

In case the lead wires 4, 4 are flattened, the shape of the lead wire may be in such a shape as shown by FIG. 8, wherein the end parts of the lead wires 4, 4 are made wide. Such wire ended configuration of the lead wires 4, 4 is helpful for good stability of the electronic component when placed on the printed circuit board for soldering.

For the lead wires 4a, 4a which are welded to the lead out wires 4, 4 of the electrolytic capacitor element 1, instead of the conventional tin-plated CP wires (which has iron core part, copper clad part and tin plated surface part), a lead-containing tin plated CP wire is found preferably through experimental study. That is, by using the above-mentioned lead-containing tin plated CP wires, there is no whiskers generated even at flattening-worked part or bending-worked part, and therefore troubles due to generation of whiskers can be completely avoided. The experimental study revealed that contents of Pb should be above about 5% at the surface of the wire in order to achieve the whisker prevention. On the contrary, when the lead content is too high, the CP wires become too soft for use. Accordingly, optimum contents of lead is about 5%.

Experimental results are shown in the below-mentioned Table 1, wherein the embodiment using the CP wires containing 5% lead and comparison sample using the conventional tin plated CP wires are shown. Examples are manufactured in the same manner, except for the contents of the lead in the CP wires, and test conditions are at 85° C. for 1000 hours leaving without load. Sixty embodiments and sixty comparison examples are prepared, and generations of whiskers are checked at the times of 250 hours lapse, 500 hours lapse, and 1000 hours lapse.

TABLE 1

|  | Initial value | 250 hours lapse | 500 hours lapse | 1000 hours lapse |
| --- | --- | --- | --- | --- |
| Embodiment of the present invention | 0/60 | 0/60 | 0/60 | 0/60 |
| Comparison example | 0/60 | 11/60 | 14/60 | 21/60 |

TABLE 1-continued

|  | Initial value | 250 hours lapse | 500 hours lapse | 1000 hours lapse |
| --- | --- | --- | --- | --- |
| (prior art) | | | | |

As shown in the above-mentioned table, the embodiments according to the present invention do not produce whiskers even after lapse of 1000 hours within sixty samples. On the contrary, in the comparison samples of the prior art, whiskers are generated on eleven samples within sixty samples at 250 hours lapse, and further at 500 hours lapse the whiskers are generated in fourteen examples, and 1000 hours lapse, twenty-one samples become to have whiskers.

As has been described, the electronic components in accordance with the present invention has an accurate and stable characteristics because the manufacturing process has no steps of high temperature and high pressure, requires only a small area of mounting on the printed circuit board because no thick plastic covering mold is provided, is easy to discriminate polarity of the lead terminals because its insulator base can be formed asymmetrically, is inexpensive in manufacturing because having no molding step in the manufacturing and is free from undesirable short-circuiting by whisker generation since lead-containing lead wire are used.

What is claimed is:

1. An electronic component comprising:
   a case containing an electronic component element therein and having a sealing part wherein an opening of said case is sealed by calking the former thereby holding a sealing member through which lead wires are led out, and
   an insulator base fixed abutted to said sealing part, and having at least one through-hole through which said lead wires are led out, and
   lead wires which are led out through said through-hole, respective end parts of said wires being bent along the outside face of said insulator base.

2. An electronic component in accordance with claim 1, wherein
   said insulator base has grooves, and
   the respective end parts of said lead wires are bent into said grooves.

3. An electronic component in accordance with claim 1, wherein:
   there are at least two lead wires, and said insulator base is of asymmetric shape with respect to the lead wires.

4. An electronic component in accordance with claim 1, wherein
   said sealing member is made of a heat resistant rubber.

5. An electronic component in accordance with claim 1, wherein
   said sealing member is composite layers comprising a rubber layer as a resilient member and a non-rubber member.

6. An electronic component in accordance with claim 2, wherein
   there are at least two lead wires, and said insulator base is of asymmetric shape with respect to the lead wires.

7. An electronic component in accordance with claim 4, wherein
   there are at least two lead wires, and said insulator base is of asymmetric shape with respect to the lead wires.

8. An electronic component in accordance with claim 1, wherein
end parts of said lead wires are flattened and of slender fan shape broader end at their tips.

9. An electronic component in accordance with claim 1, wherein
said lead wires are made of CP wires having an iron core part, a copper clad part and a tin-plated surface part which contains about 5% Pb.

10. An electronic component in accordance with claim 8, wherein
said lead wires are made of CP wires having an iron core part, a copper clad part and a tin-plated surface part which contains about 5% Pb.

* * * * *